US009646958B2

(12) United States Patent
Wang et al.

(10) Patent No.: US 9,646,958 B2
(45) Date of Patent: May 9, 2017

(54) INTEGRATED CIRCUITS INCLUDING DUMMY STRUCTURES AND METHODS OF FORMING THE SAME

(75) Inventors: Chien-Hsun Wang, Hsinchu (TW); Chih-Sheng Chang, Hsinchu (TW); Hsien-Hui Meng, Taipei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 777 days.

(21) Appl. No.: 12/726,309

(22) Filed: Mar. 17, 2010

(65) Prior Publication Data

US 2011/0227188 A1    Sep. 22, 2011

(51) Int. Cl.
*H01L 29/06* (2006.01)
*H01L 27/02* (2006.01)
*H01L 27/092* (2006.01)
*H01L 27/105* (2006.01)

(52) U.S. Cl.
CPC ........ *H01L 27/0207* (2013.01); *H01L 27/092* (2013.01); *H01L 27/105* (2013.01)

(58) Field of Classification Search
CPC .. H01L 27/0207; H01L 27/092; H01L 27/105
USPC .................. 257/620, 499, E23.151
See application file for complete search history.

(56) References Cited

U.S. PATENT DOCUMENTS

| | | | | |
|---|---|---|---|---|
| 6,128,208 A | * | 10/2000 | Itoh et al. | 365/51 |
| 6,194,252 B1 | * | 2/2001 | Yamaguchi | 438/129 |
| 6,255,697 B1 | * | 7/2001 | Yoo et al. | 257/365 |
| 6,335,560 B1 | * | 1/2002 | Takeuchi | 257/620 |
| 6,495,855 B1 | * | 12/2002 | Sawamura | 257/48 |
| 6,603,162 B1 | * | 8/2003 | Uchiyama et al. | 257/296 |
| 6,693,315 B2 | * | 2/2004 | Kuroda et al. | 257/288 |
| 6,791,128 B1 | * | 9/2004 | Yamauchi | 257/206 |
| 7,009,233 B2 | * | 3/2006 | Uchiyama et al. | 257/296 |
| 7,327,014 B2 | * | 2/2008 | Uchiyama et al. | 257/620 |
| 7,495,296 B2 | * | 2/2009 | Maeda et al. | 257/401 |
| 7,800,140 B2 | * | 9/2010 | Nakanishi et al. | 257/213 |
| 7,897,479 B2 | * | 3/2011 | Lin et al. | 438/424 |
| 7,927,782 B2 | * | 4/2011 | Aton | 430/313 |
| 8,053,346 B2 | * | 11/2011 | Ryu et al. | 438/587 |
| 8,314,635 B2 | * | 11/2012 | Law et al. | 326/41 |
| 2005/0280031 A1 | * | 12/2005 | Yano | 257/202 |
| 2006/0136848 A1 | * | 6/2006 | Ichiryu et al. | 716/1 |
| 2008/0003789 A1 | | 1/2008 | Chen et al. | |
| 2009/0127634 A1 | | 5/2009 | Tsuno | |
| 2009/0134472 A1 | * | 5/2009 | Inaba | 257/390 |

* cited by examiner

*Primary Examiner* — Ori Nadav
(74) *Attorney, Agent, or Firm* — Hauptman Ham, LLP

(57) ABSTRACT

An integrated circuit includes a core area. The core area has at least one edge region and a plurality of transistors disposed in the edge region. A plurality of dummy structures are disposed outside the core area and adjacent to the at least one edge region. Each channel of the transistors in a channel width direction faces at least one of the dummy structures.

18 Claims, 6 Drawing Sheets

INTEGRATED CIRCUITS INCLUDING DUMMY STRUCTURES AND METHODS OF FORMING THE SAME

TECHNICAL FIELD

The present application relates generally to the field of semiconductor devices, and more particularly, to integrated circuits including dummy structures and methods of forming the integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
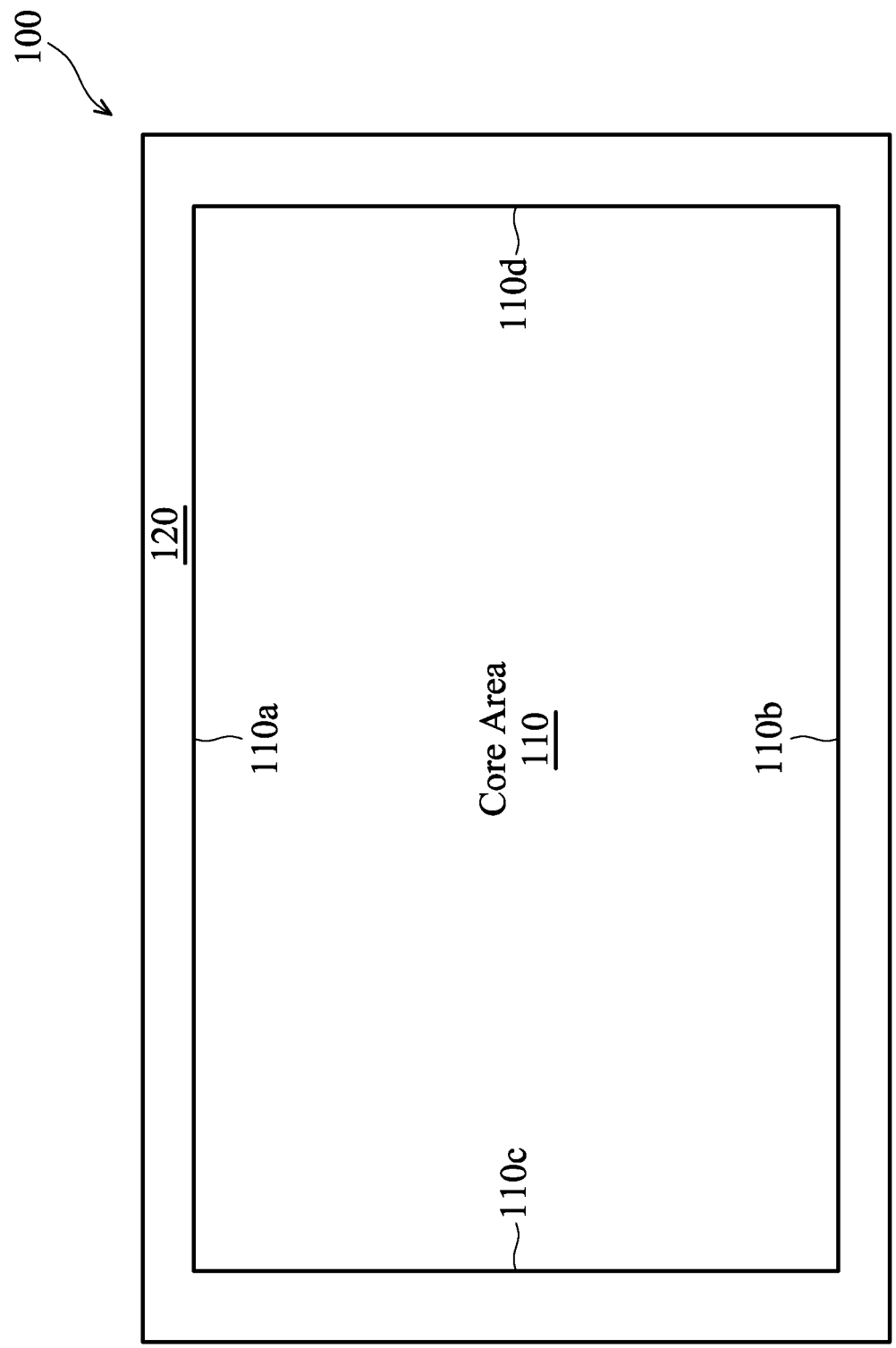
FIG. 1 is a schematic drawing illustrating an exemplary integrated circuit including a core area.

In an integrated circuit, dummy patterns are disposed at a boundary region that is adjacent to a core area. The dummy patterns are configured for reducing a process loading effect and/or transistor performance variations. The inventors found that, in the edge region, channels of transistors in the channel width direction may face a blank area without any dummy pattern or functional transistor pattern. In the blank area, a shallow trench isolation (STI) structure is formed and has a large area. The STI structure strains the channel of the transistor. The strained channel affects the operation current of the transistor. Since transistors disposed in the edge region may be subjected to different strains, the operation currents of the transistors may be diversified and fall out of a predetermined specification. The strained-channel effect becomes even worse when the dimensions of the transistors shrink down.

The inventors also found that the blank area without any dummy pattern or functional transistor pattern may also induce a dual contact etch stop layer (CESL) boundary effect. During a manufacturing process, a stress layer that is configured to provide a tensile stress layer to n-type metal-oxide-semiconductor (NMOS) transistors is generally disposed in the blank area. The stress layer in the blank area can affect a tensile stress and a compressive stress respectively applied to NMOS transistors and PMOS transistors disposed adjacent the edge of the core area.

From the foregoing observations by the inventors, integrated circuits including dummy patterns and methods for forming the integrated circuits are desired.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a schematic drawing illustrating an exemplary integrated circuit including a core area. In FIG. 1, an integrated circuit 100 includes a core area 110. A boundary region 120 is disposed around the core area 110. The core area 110 includes at least one edge, such as edges 110a-110d. The edges 110a-110d are defined to separate the core area 110 and the boundary region 120.

In some embodiments, the integrated circuit 100 is a static random access memory (SRAM) circuit, an embedded SRAM circuit, dynamic random access memory (DRAM) circuit, an embedded DRAM circuit, a non-volatile memory circuit, e.g., FLASH, EPROM, E$^2$PROME, a field-programmable gate circuit, a digital logic circuit, an analog circuit, a mixed signal circuit, or other circuit. In some embodiments, the core area 110 includes substantially all functional devices, transistors, and circuits of the integrated circuit 100. The boundary circuit 120 may include at least one input/output (I/O) circuit.

In some embodiments, the integrated circuit 100 include a plurality of dummy structures (not shown) disposed adjacent to the at least one edge region that is adjacent to one of the edges 110a-110d. The dummy structures includes, for example, OD dummy patterns, gate dummy patterns, well dummy patterns, metal dummy patterns, other dummy patterns, or combinations thereof.

A plurality of transistors (not shown) are disposed, in some embodiments, in the at least one edge region. Each transistor has a transistor channel. Each channel of the transistors in a channel width direction faces at least one of the dummy structures. In some embodiments, each dummy structure includes one or more rows of dummy patterns. In other embodiments, each dummy structure includes one or more columns of dummy patterns. Each channel of the transistors in the channel width direction faces at least one of the row or column dummy patterns. Since each channel of the transistors is confined by neighboring dummy patterns and/or functional transistor patterns, a strain stress applied to each channel of the transistors is desirably controlled.

Figure 2:
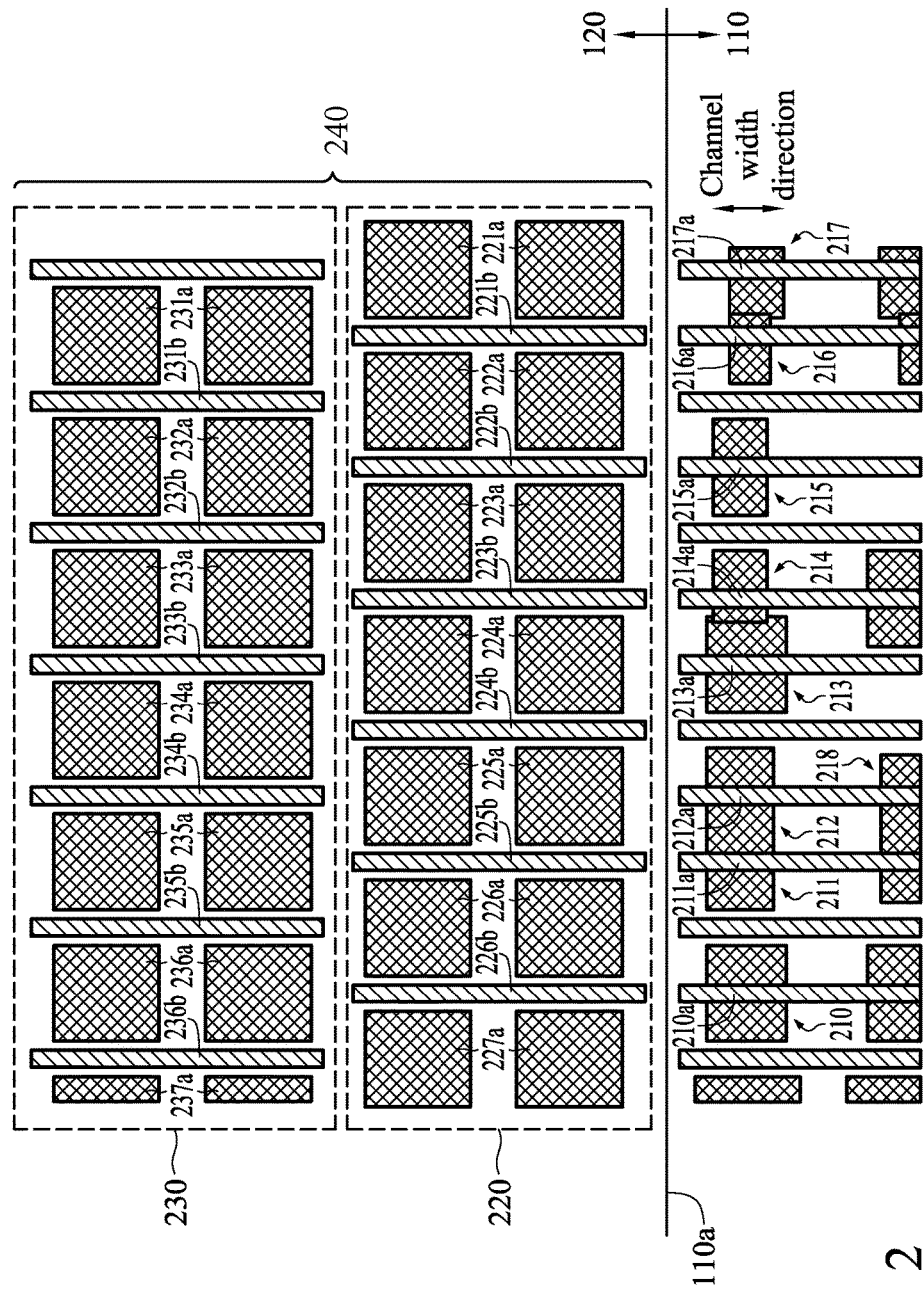
FIG. 2 is a schematic drawing illustrating a magnified view of a portion of an exemplary edge region of the core area 110 shown in FIG. 1.

FIG. 2 is a schematic drawing illustrating a magnified view of a portion of an exemplary edge region of the core area 110 shown in FIG. 1. Merely for the purpose of explanation, FIG. 2 shows patterns of an oxide definition (OD) layer and a gate layer. The OD layer is a region of the substrate implanted with ions which impact conductivity of the substrate. In FIG. 2, the edge region (not labeled) adjacent to the edge 110a of the core area 110 includes a plurality of transistors, e.g., transistors 210-217. The transistors 210-217 include a plurality of OD patterns (not labeled) and gate electrodes (not labeled). Each of the transistors 210-217 has a channel, e.g., channel 210a-217a, respectively. The channels 210a-217a are defined by overlapped areas of the OD patterns and the gate electrodes. The channel 210a-217a have the same channel width direction that is the vertical direction in view of FIG. 2.

Referring to FIG. 2, a dummy structure 240 includes a plurality of first dummy patterns 220 and a plurality of second dummy patterns 230. The first dummy patterns 220 are disposed adjacent to the edge region of the core area 110. The second dummy patterns 230 are disposed adjacent to the first dummy patterns 220. In some embodiments, the dummy patterns 220 and 230 include OD dummy patterns, gate dummy patterns, well dummy patterns, metal dummy patterns, dummy patterns of other layers, or any combinations thereof. In the embodiment shown in FIG. 2, the dummy patterns 220 include OD dummy patterns 221a-227a and gate dummy patterns 221b-226b. The dummy patterns 230 include OD dummy patterns 231a-237a and gate dummy patterns 231b-237b. The shape of the OD dummy patterns 221a-227a and/or 231a-237a includes square, rectangular, triangular, round, oval, hexagonal, octagonal, other desired shapes, or any combinations thereof.

In FIG. 2, each of the dummy patterns 220 and 230 includes two rows of OD dummy patterns. However, the scope of this application is not limited thereto. In some embodiments, the dummy patterns 220 and 230 have the same number of rows of OD dummy patterns. In other embodiments, each of the dummy patterns 220 and 230 includes a single row of OD dummy patterns or more than two rows of OD dummy patterns. In still other embodiments, each of the gate dummy patterns 221b-226b and 231b-237b is a single continuous gate dummy pattern or several discrete gate dummy patterns.

Referring to FIG. 2, the OD dummy patterns 221a-227a are misaligned from the OD dummy patterns 231a-237a, respectively. The gate dummy patterns 221b-226b are misaligned from the gate dummy patterns 231b-236b, respectively. In some embodiments, the gate dummy patterns 221b-227b substantially face centers of the OD dummy patterns 231a-236a, respectively. In other embodiments, the gate dummy patterns 221b-227b are slightly shifted from the centers of the OD dummy patterns 231a-236a, respectively.

Referring again to FIG. 2, each of the channels 210a-217a in the channel width direction face either one of the dummy patterns 220 or one of the dummy patterns 230. In some embodiments, the channels 212a, 213a, and 217a face the OD dummy patterns 225a, 224a, and 221a, respectively, whereas the channels 210a, 211a, 214a, 215a, and 216a face the OD dummy patterns 236a, 235a, 233a, 232a, and 231a, respectively. In other embodiments, the channel 212a, 213a, and 217a face the gate dummy patterns 234b, 233b, and 237b, respectively, whereas, the channel 210a, 211a, 214a, 215a, and 216a face the gate dummy patterns 226b, 225b, 223b, 222b, and 221b, respectively.

As noted, each of the channels 210a-217a is confined by neighboring dummy patterns and/or functional transistor patterns. For example, the channel 212a is confined by the OD dummy pattern 225a and neighboring patterns of the transistors 210, 211, 213, and/or 218. A strain stress applied to the channel 221a is desirably controlled. The OD spacing effect can thus be reduced. It is also found that the use of the dummy structure 240 can reduce the well proximity effect and/or the dual CESL boundary effect.

It is noted that the dummy patterns 220 and 230 described above in conjunction with FIG. 2 are merely exemplary. In some embodiments, additional dummy patterns (not shown) are disposed adjacent to the dummy patterns 230. The additional dummy patterns, in one or more embodiments, have patterns similar to those of the dummy patterns 230. The additional dummy pattern or patterns, in one or more embodiments, is/are misaligned from the dummy patterns 230 and/or from adjacent additional dummy pattern(s).

Figure 3:
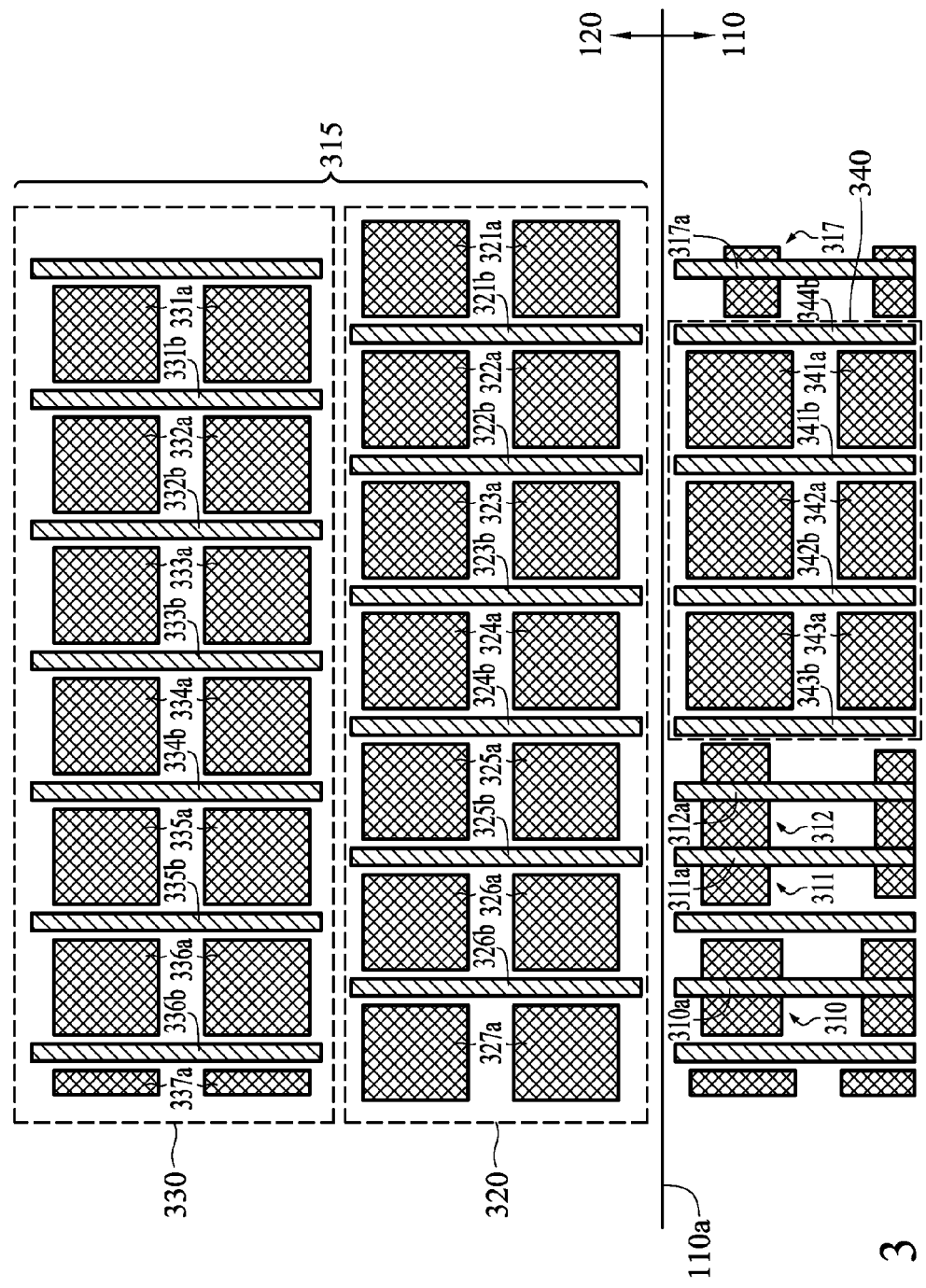
FIG. 3 is a schematic drawing illustrating a magnified view of a portion of another exemplary edge region of the core area 110 shown in FIG. 1.

FIG. 3 is a schematic drawing illustrating a magnified view of a portion of another exemplary edge region of the core area 110 shown in FIG. 1. Items of FIG. 3 that are the same items in FIG. 2 are indicated by the same reference numerals, increased by 100. In FIG. 3, a plurality of dummy patterns 340 are disposed in the edge region of the core area 110. In some embodiments, the dummy patterns 340 are disposed between two transistors, e.g., transistors 312 and 317. The dummy patterns 340 are configured to confine the transistors 312, 317 and/or transistors (not shown) below the dummy patterns 340.

In some embodiments, the dummy patterns 340 include OD dummy patterns, gate dummy patterns, well dummy patterns, other dummy patterns, or combinations thereof. In the embodiment shown in FIG. 3, the dummy patterns 340 include OD dummy patterns 341a-343a and gate dummy patterns 341b-344b. The OD dummy patterns 341a-343a are substantially aligned with the OD dummy patterns 322a-324a, respectively. The gate dummy patterns 341b-344b are substantially aligned with the gate dummy patterns 322b-324b and 321b, respectively. It is noted the description above regarding the OD dummy patterns 322a-324a and the gate dummy patterns 341b-344b is merely exemplary. In some embodiments, the OD dummy patterns 341a-343a are misaligned from the OD dummy patterns 322a-324a, respectively, and/or the gate dummy patterns 341b-344b are misaligned from the gate dummy patterns 322b-324b and 321b, respectively.

Figure 4:
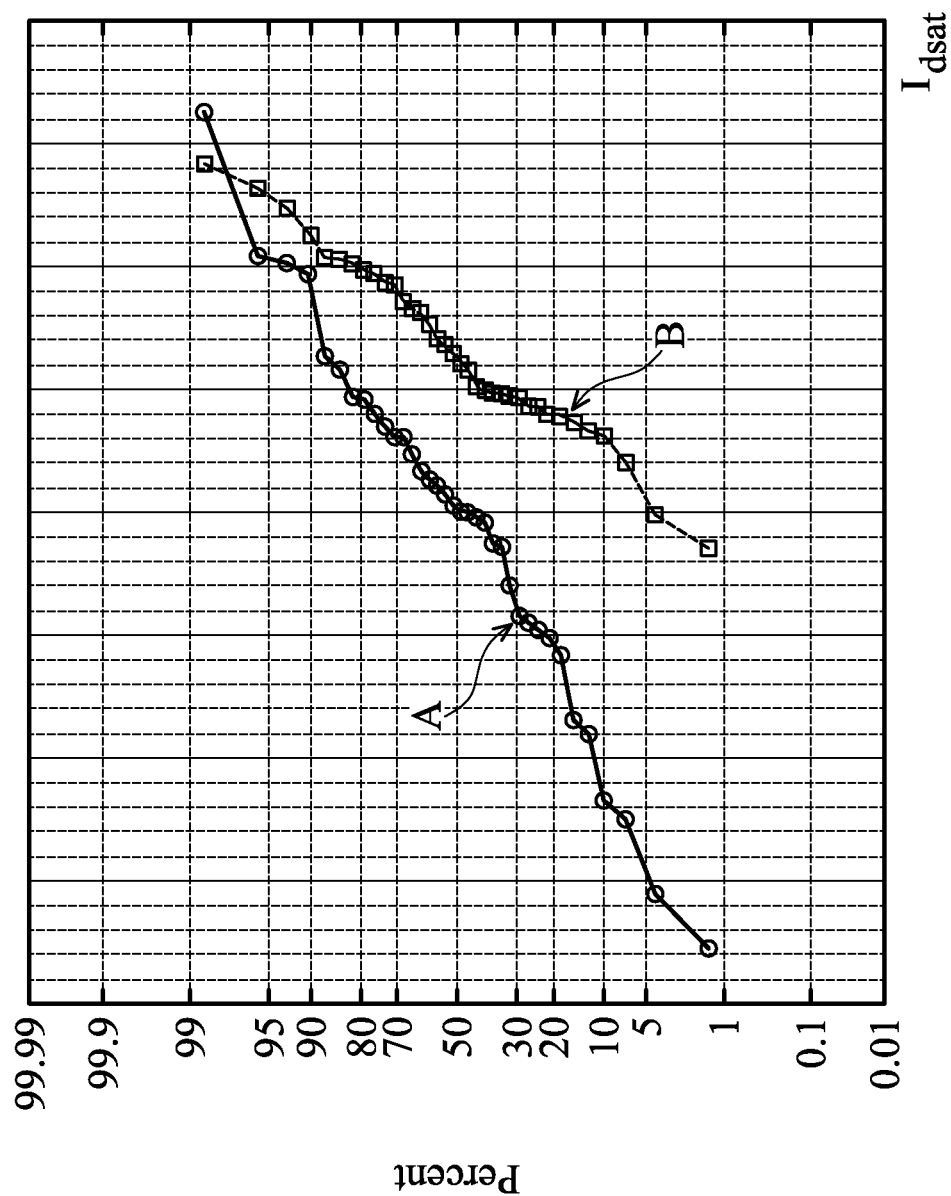
FIG. 4 is a schematic drawing illustrating curves representing variations of operation currents of transistors.

FIG. 4 is a schematic drawing illustrating curves representing variations of operation currents of transistors. In FIG. 4, the vertical axis represents a cumulative percentage and the horizontal axis represents an operation current $I_{dsat}$ of transistors. As noted, the transistors disposed in the edge region of a regular integrated circuit face a blank area without any dummy pattern in the channel width direction. The blank area may strain the channels of the transistors, resulting in the variations of the operation current $I_{dsat}$ of transistors. Due to the strain stress, the variation of the operation current $I_{dsat}$ of transistors is increased as indicated by curve A shown in FIG. 4.

Conversely, each channel of the transistors of embodiments of this application face at least one of the dummy structures exemplarily described above in conjunction with FIGS. 1-3. The channels of the transistors disposed at the edge region are desirably confined. The curve B shown in FIG. 4 represents the variation of the operation current $I_{dsat}$ of the transistors of the disclosed embodiments of this application. As shown, the curve B has a slope steeper than that of curve A, indicating higher performance.

Figure 5:
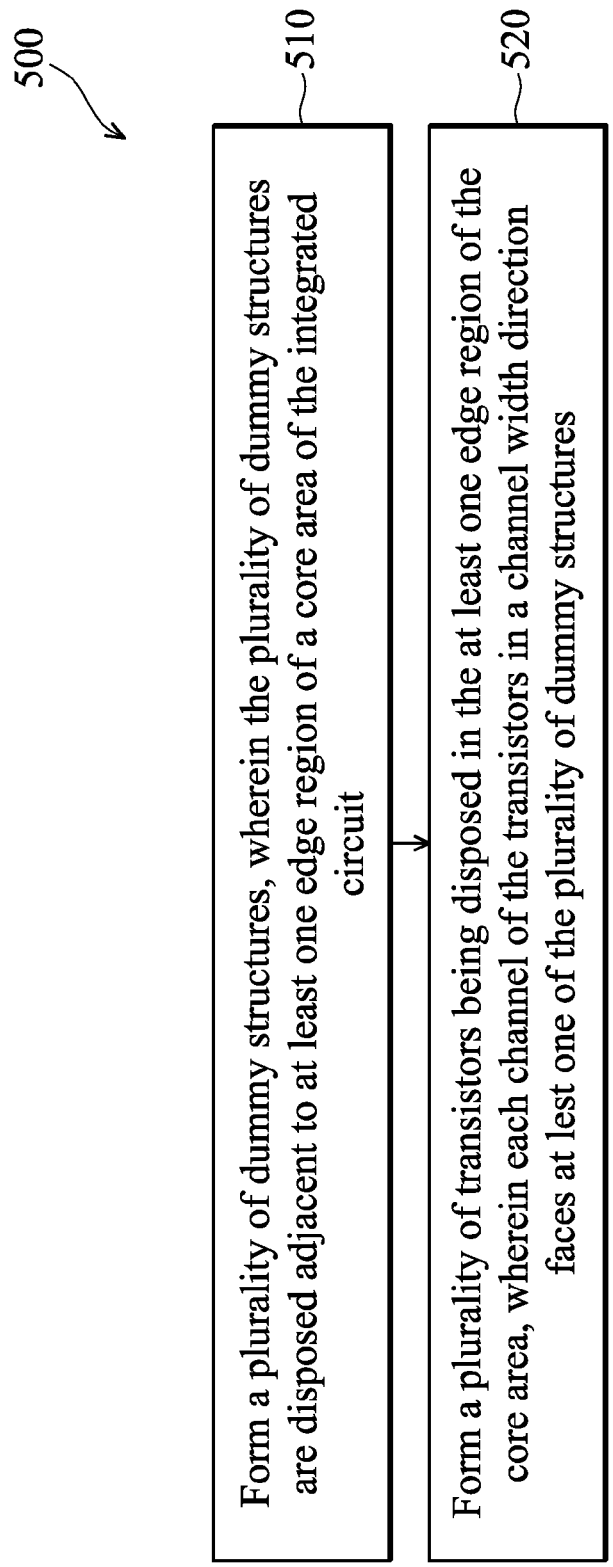
FIG. 5 is a schematic flow chart showing an exemplary method for forming an integrated circuit including a plurality of dummy structures.

FIG. 5 is a schematic flow chart showing an exemplary method for forming an integrated circuit including a plurality of dummy structures. In FIG. 5, a method 500 for forming an integrated circuit includes forming a plurality of dummy structures. The dummy structures are disposed adjacent to at least one edge region of a core area of the integrated circuit (step 510). The method 500 further includes forming a plurality of transistors that are disposed in the at least one edge region of the core area. Each channel of the transistors in a channel width direction faces at least one of the dummy structures (step 520).

In the embodiment for forming the integrated circuit 100 described above in conjunction with FIG. 2, step 510 includes forming the dummy patterns 221a-227a and 221b-226b and the dummy patterns 231a-237a and 231b-237b. As noted, the dummy patterns 221a-227a and 221b-226b are disposed adjacent to at least one edge region of the core area 110 of the integrated circuit 100. The dummy patterns 231a-237a and 231b-237b are disposed adjacent to and misaligned from the dummy patterns 221a-227a and 221b-226b, respectively. Each channel of the transistors 210-217 in the channel width direction faces one of the dummy patterns 221a-227a and 221b-226b or one of the dummy patterns 231a-237a and 231b-237b.

In some embodiments, the dummy patterns 221a-227a, 221b-226b, 231a-237a, and 231b-237b are formed over and/or within a substrate (not shown). The substrate may include an elementary semiconductor material, a compound semiconductor material, an alloy semiconductor material, or any other suitable material or combinations thereof. The elementary semiconductor material includes silicon or germanium in crystal, polycrystalline, or an amorphous structure. The compound semiconductor material includes silicon carbide, gallium arsenide, gallium phosphide, indium phosphide, indium arsenide, and indium antimonide. The alloy semiconductor material includes SiGe, GaAsP, AlInAs, AlGaAs, GaInAs, GaInP, and GaInAsP. In one embodiment, the alloy semiconductor substrate may have a gradient SiGe feature in which the Si and Ge composition change from one ratio at one location to another ratio at another location. In another embodiment, the alloy SiGe is formed over a silicon substrate. In another embodiment, a SiGe substrate is strained. Furthermore, the semiconductor substrate may be a semiconductor on insulator, such as a silicon on insulator (SOI), or a thin film transistor (TFT). In some examples, the semiconductor substrate may include a doped epitaxial layer or a buried layer. In other examples, the compound semiconductor substrate may have a multilayer structure, or the substrate may include a multilayer compound semiconductor structure.

In some embodiments, the OD dummy patterns 221a-227a and 231a-237a and the OD patterns of the transistors 210-217 are defined over the substrate. The OD dummy patterns 221a-227a and 231a-237a and the OD patterns of the transistors 210-217 are surrounded by an isolation material (not shown). The isolation material electrically isolates two neighboring OD patterns of the transistors 210-217 in the core area 110. The isolation material includes a shallow trench isolation (STI) structure, a local oxidation of silicon (LOCOS) structure, other isolation structure, or any combination thereof. The isolation material is formed, for example, by an STI process, a LOCOS process, or combinations thereof.

In some embodiments, dummy well patterns (not shown) and well patterns of the transistors 210-217 are defined over or within the substrate. Defining the dummy well patterns and well patterns of the transistors 210-217 is performed before or after the formation of the OD dummy patterns 221a-227a and 231a-237a and the OD patterns of the transistors 210-217. In some embodiments, the dummy well patterns and well patterns of the transistors 210-217 are formed by any suitable process, such as ion implantation and/or a rapid thermal process (RTP) to activate the doped regions.

In some embodiments, the dummy gate patterns 221b-226b and 231b-237b and the gate electrodes of the transistors 210-217 are formed over the substrate. The dummy gate patterns 221b-226b and 231b-237b and the gate electrodes of the transistors 210-217 include one or more materials including polysilicon, Ti, TiN, TaN, Ta, TaC, TaSiN, W, WN, MoN, MoON, $RuO_2$, and/or other suitable materials. The dummy gate patterns 221b-226b and 231b-237b and the gate electrodes of the transistors 210-217 may include one or more layers formed by physical vapor deposition (PVD), CVD, ALD, plating, and/or other suitable processes. The deposition layer is defined by, e.g., photolithographic process and/or etch process for forming the dummy gate patterns 221b-226b and 231b-237b and the gate electrodes of the transistors 210-217.

In other embodiments, the dummy gate patterns 221b-226b and 231b-237b and/or the gate electrodes of the transistors 210-217 include a work function metal layer such that it provides an N-metal work function or P-metal work function of a metal gate. P-type work function materials include compositions such as ruthenium, palladium, platinum, cobalt, nickel, and conductive metal oxides, and/or other suitable materials. N-type metal materials include compositions such as hafnium, zirconium, titanium, tantalum, aluminum, metal carbides (e.g., hafnium carbide, zirconium carbide, titanium carbide, aluminum carbide), aluminides, and/or other suitable materials.

In some embodiments, at least one gate dielectric (not shown) is formed between the OD patterns and the gate electrodes of the transistors 210-217. The gate dielectric includes a single layer or a multi-layer structure. In embodiments having a multi-layer structure, the gate dielectric includes an interfacial dielectric layer and a high-k dielectric layer. The interfacial dielectric layer may be formed by any suitable process and any suitable thickness. For example, the interfacial dielectric layer may include a material such as silicon oxide, silicon nitride, silicon oxynitride, other gate dielectric materials, and/or combinations thereof. The interfacial dielectric layer is formed, in one or more embodiments, by thermal processes, CVD processes, ALD processes, epitaxial processes, and/or combinations thereof.

The high-k dielectric layer is formed, in some embodiments, over the interfacial layer. The high-k dielectric layer includes high-k dielectric materials such as $HfO_2$, HfSiO, HfSiON, HfTaO, HfTiO, HfZrO, other suitable high-k dielectric materials, and/or combinations thereof. The high-k material may further be selected from metal oxides, metal nitrides, metal silicates, transition metal-oxides, transition metal-nitrides, transition metal-silicates, oxynitrides of metals, metal aluminates, zirconium silicate, zirconium aluminate, silicon oxide, silicon nitride, silicon oxynitride, zirconium oxide, titanium oxide, aluminum oxide, hafnium dioxide-alumina alloy, other suitable materials, and/or combinations thereof. The high-k dielectric layer may be formed by any suitable process, such as ALD, CVD, PVD, RPCVD, PECVD, MOCVD, sputtering, plating, other suitable processes, and/or combinations thereof.

In some embodiments, source/drain (S/D) regions of the transistors 210-217 are formed in the OD patterns of the transistors 210-217. For example, at least one ion implantation process is performed for implanting ions in the source/drain regions of the transistors 210-217. The S/D regions are N-type S/D regions or p-type S/D regions. The n-type S/D regions have dopants such as Arsenic (As), Phosphorus (P), other group V element, or the combinations thereof. The p-type S/D regions have dopants such as Boron (B) or other group III element. In embodiments, a thermal process and/or rapid thermal process (RTP) is/are performed after the ion implantation processes.

In some embodiments, dielectric materials, via plugs, metallic regions, and/or metallic lines are formed over the gate electrodes of the transistors 210-217 for interconnection. The dielectric layers may include materials such as silicon oxide, silicon nitride, silicon oxynitride, low-k dielectric material, ultra low-k dielectric material, or any combinations thereof. The via plugs, metallic regions, and/or metallic lines include materials such as tungsten, aluminum, copper, titanium, tantalum, titanium nitride, tantalum nitride, nickel silicide, cobalt silicide, other proper conductive materials, and/or combinations thereof. The via plugs, metallic regions, and/or metallic lines are formed by any suitable processes, such as deposition, photolithography, and etching processes, and/or combinations thereof.

It is noted that the method 500 of forming the integrated circuit including the dummy structures described above in conjunction with FIG. 5 is merely exemplary. In some embodiments, the method 500 includes defining additional dummy patterns (not shown) adjacent to the dummy patterns 230. The additional dummy patterns, in some embodiments, have patterns similar to those of the dummy patterns 230. The additional dummy pattern or patterns, in one or more embodiments, are misaligned from the dummy patterns 230 and/or from adjacent additional dummy pattern(s). The additional dummy patterns are formed, in some embodiments, by the processes forming the dummy patterns 220 and 230.

In the embodiment forming the integrated circuit 100 described above in conjunction with FIG. 3, the method 500 further includes defining the dummy patterns 340 between two transistors, e.g., transistors 312 and 317. The dummy patterns 340 are configured to confine the transistors 312, 317 and/or transistors (not shown) below the dummy patterns 340. The dummy patterns 340 are formed, in some embodiments, by the processes forming the dummy patterns 320 and 330.

Figure 6:
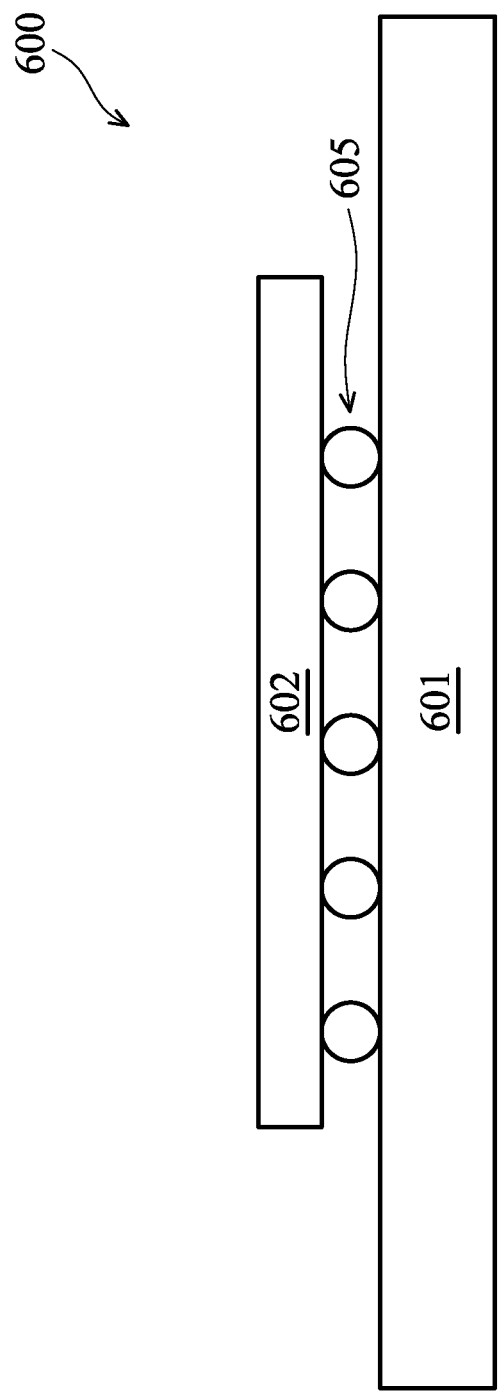
FIG. 6 is a schematic drawing illustrating a system including an exemplary integrated circuit disposed over a substrate board.

FIG. 6 is a schematic drawing illustrating a system including an exemplary integrated circuit disposed over a substrate board. In FIG. 6, a system 600 includes an integrated circuit 602 disposed over a substrate board 601. The substrate board 601 includes, in some embodiments, a printed circuit board (PCB), a printed wiring board and/or other carrier that is capable of carrying an integrated circuit. The integrated circuit 602 includes dummy structures that are similar to the dummy patterns described above in conjunction with FIGS. 1-3. The integrated circuit 602 is electrically coupled with the substrate board 601. In some embodiments, the integrated circuit 602 is electrically coupled with the substrate board 601 through bumps 605 as shown in FIG. 6. In other embodiments, the integrated circuit 602 is electrically coupled with the substrate board 601 through wire bonding (not shown). The system 600, in some embodiments, is part of an electronic system such as computers, wireless communication devices, computer-related peripherals, entertainment devices, or the like.

In some embodiments, the system 600 including the integrated circuit 602 includes an entire system in one IC, so-called system-on-chip (SOC) or system-on-integrated-circuit (SOIC) devices. These SOC/SOIC devices provide, for example, all of the circuitry needed to implement a cell phone, personal data assistant (PDA), digital VCR, digital camcorder, digital camera, MP3 player, or the like in a single integrated circuit.

Form the foregoing description, a first embodiment of this application provides an integrated circuit including dummy structures. The integrated circuit includes a core area. The core area has at least one edge region. A plurality of transistors are disposed in the edge region. A plurality of dummy structures are disposed adjacent to the at least one edge region. Each channel of the transistors in a channel width direction faces at least one of the dummy structures.

In a second embodiment, a method for forming an integrated circuit includes forming a plurality of dummy structures. The dummy structures are disposed adjacent to at least one edge region of a core area of the integrated circuit. A plurality of transistors are formed and disposed in the at least one edge region of the core area. Each channel of the transistors in a channel width direction faces at least one of the dummy structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated circuit, comprising:
a boundary region comprising an input/output circuit;
a core area comprising functional elements of the integrated circuit located exclusively in the core area, the boundary region and the core area defining an edge separating, in plan view, the boundary region and the core area;
a plurality of transistors disposed in the core area and adjacent to the edge, the plurality of transistors being functional elements of the integrated circuit; and a plurality of first gate dummy structures disposed in the boundary region and adjacent to the edge, wherein each transistor of the plurality of transistors comprises a channel having a channel width direction substantially perpendicular to the edge, each channel of the plurality of transistors is aligned with a corresponding first gate dummy structure of the plurality of first gate dummy structures along the channel width direction without an intervening dummy structure therebetween, each element of the boundary region adjacent the edge is a first gate dummy structure of the plurality of first gate dummy structures; and a plurality of second gate dummy structures, wherein an entirety of each second gate dummy structure of the plurality of second gate dummy structures is farther from the edge than each first gate dummy structure of the plurality of first gate dummy structures, and each second gate dummy structure of the plurality of second gate dummy structures and each first gate dummy structure of the plurality of first gate dummy structures is aligned with a channel of a corresponding transistor of the plurality of transistors in an alternating fashion.

2. The integrated circuit of claim 1, further comprising a plurality of oxide definition (OD) dummy patterns, wherein each OD dummy pattern of the plurality of OD dummy patterns is between adjacent first gate patterns of the plurality of first gate patterns.

3. The integrated circuit of claim 1, further comprising:
a plurality of third dummy patterns, wherein the third dummy patterns are disposed in the core area, between two of the plurality of transistors, and substantially aligned with the first gate dummy patterns along the channel width direction.

4. The integrated circuit of claim 3, wherein the third dummy patterns include at least one selected from the group consisting of oxide definition (OD) dummy patterns, well dummy patterns, gate dummy patterns, and metal dummy patterns.

5. The integrated circuit of claim 1, further comprising:
a plurality of fourth dummy patterns, wherein the fourth dummy patterns are disposed adjacent to the second gate dummy patterns and misaligned, along the channel width direction, from the second gate dummy patterns.

6. The integrated circuit of claim 5, wherein the fourth dummy patterns include at least one selected from the group consisting of oxide definition (OD) dummy patterns, well dummy patterns, gate dummy patterns, and metal dummy patterns.

7. The integrated circuit of claim 1, each transistor of the plurality of transistors further comprises an OD pattern by which the channel thereof is defined.

8. An integrated circuit, comprising:
a boundary region comprising an input/output circuit;
a core area comprising functional elements of the integrated circuit located exclusively in the core area, the boundary region and the core area defining an edge separating, in plan view, the boundary region and the core area;
a plurality of transistors disposed in the core area and adjacent to the edge, the plurality of transistors being functional elements of the integrated circuit;
a plurality of first oxide definition (OD) dummy patterns disposed in the boundary region and adjacent to the edge, wherein adjacent first OD dummy patterns are defined on opposite sides of a first dummy gate; and
a plurality of second OD dummy patterns that are disposed in the boundary region, wherein adjacent second OD dummy patterns are defined on opposite sides of a second dummy gate, the plurality of first OD dummy patterns are closer to the edge than the plurality of second OD dummy patterns, and the plurality of second OD dummy patterns misaligned, along a direction perpendicular to the edge, from the plurality of first OD dummy patterns, and a center of each second OD dummy pattern of the plurality of second OD dummy patterns and a center of each first OD dummy pattern of the plurality of first OD dummy patterns is aligned with a channel of a corresponding transistor of the plurality of transistors in an alternating fashion.

9. The integrated circuit of claim 8, further comprising:
a plurality of third OD dummy patterns, wherein each third OD dummy pattern of the third OD dummy patterns is disposed in the core area, between two of the transistors, and substantially aligned with a corresponding first OD dummy pattern of the plurality of first OD dummy patterns along the direction.

10. The integrated circuit of claim 8, further comprising:
a plurality of fourth OD dummy patterns, wherein each fourth OD dummy pattern of the fourth OD dummy patterns is disposed adjacent to corresponding second OD dummy patterns of the plurality of second OD dummy patterns and misaligned from the second OD dummy patterns along the direction.

11. The integrated circuit of claim 8, further comprising:
a plurality of first gate dummy patterns, wherein each of the first gate dummy patterns is disposed between two of the first OD dummy patterns.

12. The integrated circuit of claim 11, further comprising:
a plurality of second gate dummy patterns, wherein each of the second gate dummy patterns is disposed between two of the second OD dummy patterns.

13. An integrated circuit, comprising:
a boundary region comprising an input/output circuit;
a core area comprising functional elements of the integrated circuit located exclusively in the core area, the boundary region and the core area defining an edge separating, in plan view, the boundary region and the core area;
a plurality of transistors disposed in the core area and adjacent to the edge, the plurality of transistors being functional elements of the integrated circuit;
a plurality of first gate dummy patterns disposed in the boundary region and adjacent to the edge, wherein a channel of every transistor of the plurality of transistors in the core area adjacent to the boundary region is aligned with a corresponding gate dummy pattern of the plurality of first gate dummy patterns along a channel width direction without an intervening dummy pattern therebetween; and
a plurality of second dummy patterns disposed in the core area and between a transistor of the plurality of transistors and a single active transistor, wherein the single active transistor is the only active transistor between a periphery of the core region and the plurality of second dummy patterns, and a gate of each dummy pattern of the plurality of second dummy patterns is substantially aligned with a corresponding gate dummy pattern of the plurality of first gate dummy patterns along the channel width direction without an intervening active transistor.

14. The integrated circuit of claim 13, further comprising a plurality of oxide definition (OD) dummy patterns, wherein each OD dummy pattern of the plurality of OD dummy patterns is between adjacent first gate patterns of the plurality of first gate patterns.

15. The integrated circuit of claim 13, further comprising:

first oxide definition (OD) dummy patterns disposed in the boundary region, wherein a pair of adjacent first OD dummy patterns sandwich one of the first gate dummy patterns therebetween; and second OD dummy patterns disposed in the core area and between two of the transistors, wherein a pair of adjacent second OD dummy patterns sandwich one of the second gate dummy patterns therebetween.

16. The integrated circuit of claim 15, wherein each transistor of the plurality of transistors further comprises an OD pattern by which the channel thereof is defined.

17. The integrated circuit of claim 16, wherein a width of each of the OD patterns of the plurality of transistors in the channel width direction is smaller than that of each of the first and second OD dummy patterns.

18. The integrated circuit of claim 15, wherein each of the second OD dummy patterns is substantially aligned with one of the first OD dummy patterns along the channel width direction.

* * * * *